(12) United States Patent
Sepic et al.

(10) Patent No.: US 10,278,302 B2
(45) Date of Patent: Apr. 30, 2019

(54) DEVICE, SYSTEM AND METHOD FOR PROVIDING ZONE-BASED CONFIGURATION OF SOCKET STRUCTURES

(71) Applicant: Intel Corporation, Santa Clara, CA (US)

(72) Inventors: Anne M. Sepic, Phoenix, AZ (US); Zhen Zhou, Tucson, AZ (US); Evan M. Fledell, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 20 days.

(21) Appl. No.: 14/757,972

(22) Filed: Dec. 23, 2015

(65) Prior Publication Data

US 2017/0187133 A1 Jun. 29, 2017

(51) Int. Cl.
*H05K 7/10* (2006.01)
*G01R 1/04* (2006.01)
*H01R 12/70* (2011.01)
*H01R 12/50* (2011.01)
(Continued)

(52) U.S. Cl.
CPC ......... *H05K 7/1069* (2013.01); *G01R 1/0466* (2013.01); *H01R 12/7076* (2013.01); *H01R 12/7082* (2013.01); *H01R 23/6806* (2013.01); *H05K 3/301* (2013.01); *H05K 7/1023* (2013.01); *H05K 7/1038* (2013.01); *H05K 7/1061* (2013.01); *H05K 1/181* (2013.01); *H05K 2201/10325* (2013.01); *H05K 2201/2018* (2013.01)

(58) Field of Classification Search
CPC .. H05K 7/1038; H05K 7/1023; H05K 7/1069; H01R 23/6806; G01R 1/0466
See application file for complete search history.

(56) References Cited

U.S. PATENT DOCUMENTS 8,269,516 B1 9/2012 Mardi et al.
9,252,521 B1 * 2/2016 Beaman .............. H01R 12/718
(Continued)

OTHER PUBLICATIONS

International Search Report and Written Opinion for PCT Patent Application No. PCT/US16/58876 dated Jan. 31, 2017, 16 pgs.
(Continued)

*Primary Examiner* — James Harvey
(74) *Attorney, Agent, or Firm* — Schwabe, Williamson & Wyatt P.C.

(57) ABSTRACT

Techniques and mechanisms for providing socket connection to a substrate. In an embodiment, a socket device includes a first socket body portion that is to provide for signal exchanges as part of a socket connector including the first socket body portion and a second socket body portion. The first socket body portion and the second socket body portion comprise respective zones, wherein, of the two zones, only one such zone has a first electro-mechanical characteristic. The first electro-mechanical characteristic is selected from the group consisting of an interconnect dimension, an interconnect material, an interconnect structure, a socket body material, and a shielding structure. In another embodiment, modular socket sub-assemblies each comprise a respective one of the first zone and the second zone.

24 Claims, 9 Drawing Sheets

(51) Int. Cl.
*H05K 3/30* (2006.01)
*H05K 1/18* (2006.01)

(56) References Cited

U.S. PATENT DOCUMENTS

| | | | |
|---|---|---|---|
| 2005/0046433 A1* | 3/2005 | Treibergs | G01R 1/045 |
| | | | 324/750.25 |
| 2005/0207131 A1* | 9/2005 | Prokofiev | H01L 23/50 |
| | | | 361/760 |
| 2007/0264846 A1 | 11/2007 | Takagi | |
| 2007/0269999 A1* | 11/2007 | Di Stefano | G01R 1/0466 |
| | | | 439/73 |
| 2008/0088331 A1* | 4/2008 | Yoshida | G01R 1/0466 |
| | | | 324/755.05 |
| 2011/0156739 A1 | 6/2011 | Chang et al. | |
| 2012/0025861 A1 | 2/2012 | Park et al. | |
| 2014/0091824 A1* | 4/2014 | Fledell | H02J 15/00 |
| | | | 324/755.11 |
| 2014/0093214 A1 | 4/2014 | Detofsky et al. | |
| 2014/0327462 A1* | 11/2014 | Jeong | G01R 1/0466 |
| | | | 324/756.02 |
| 2015/0168450 A1 | 6/2015 | Wooden et al. | |
| 2015/0369840 A1* | 12/2015 | Treibergs | G01R 1/0483 |
| | | | 324/755.05 |
| 2016/0018440 A1* | 1/2016 | Chung | G01R 1/06722 |
| | | | 324/755.05 |

OTHER PUBLICATIONS

International Preliminary Report on Patentability for PCT Patent Application No. PCT/US2016/058876 dated Jul. 5, 2018, 12 pgs.

* cited by examiner

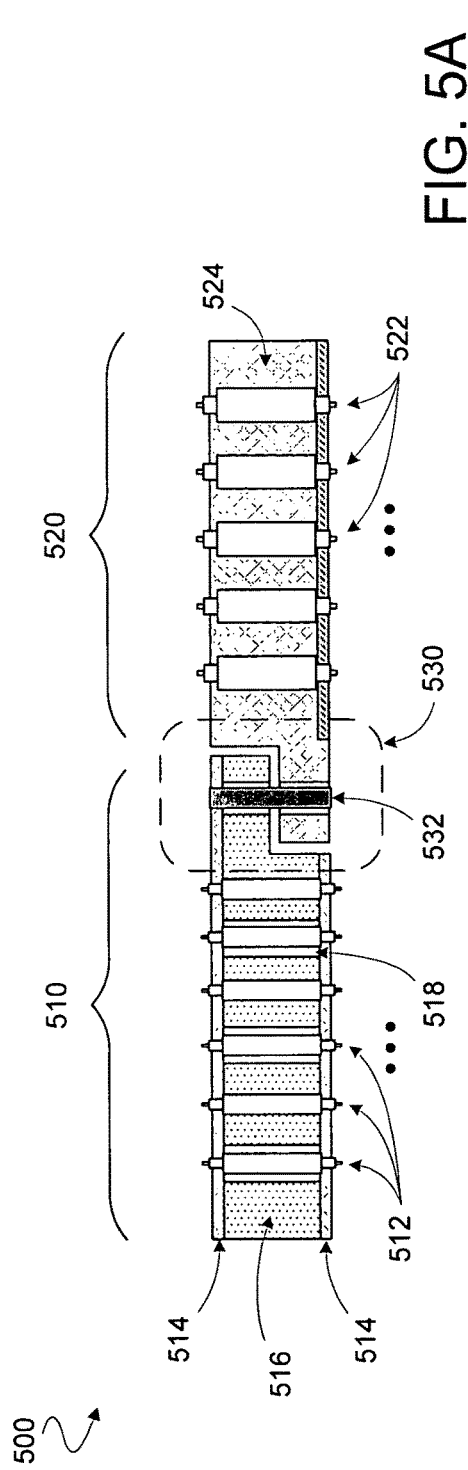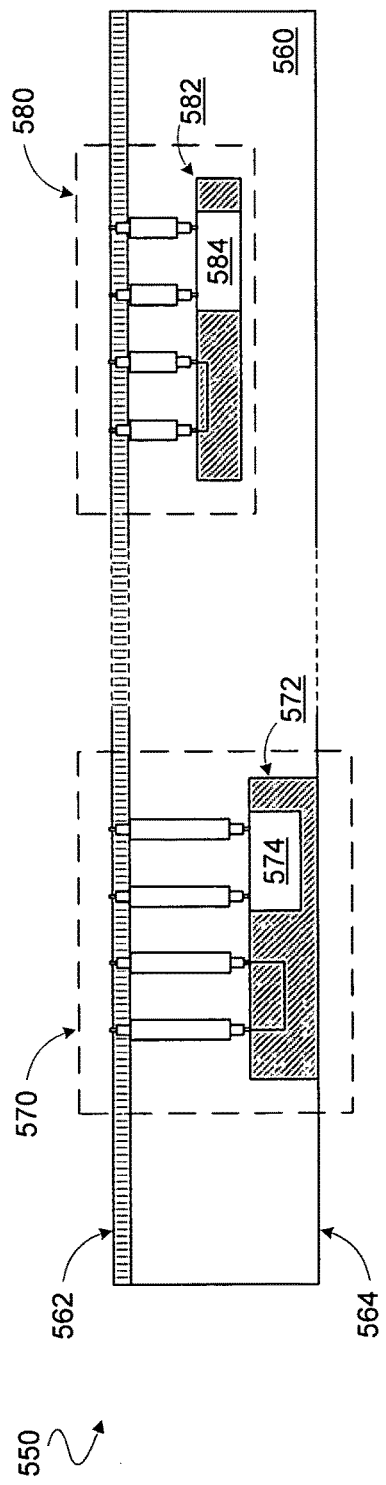
FIG. 5A
FIG. 5B

DEVICE, SYSTEM AND METHOD FOR PROVIDING ZONE-BASED CONFIGURATION OF SOCKET STRUCTURES

BACKGROUND

1. Technical Field

Embodiments of the invention relate generally to socket connection hardware and more particularly, but not exclusively, to a modular test socket.

2. Background Art

Socket connectors comprise a large number of electrically conductive structures, such as spring probes ("pogo pins"), to provide at least temporary electrical coupling. In a typical use case, a socket couples integrated circuitry, such as a microprocessor unit, to other hardware that is to aid in testing of such circuitry. The hardware may include a tester platform or a printed circuit board (PCB) that provides fan-out of signals to be provided to such a tester platform.

Current socket technologies variously use a single interconnect architecture for all pins of a socket. In the case of testing during high volume manufacturing (HVM), signals to be exchanged by various pins of a test socket have different respective frequencies, voltage ranges, current levels and/or other characteristics. Existing socket design regimes identify the signal which imposes the most limiting constraints and, based on those constraints, determine socket structure that is applied across all pins of the test socket. As successive generations of integrated circuit fabrication continue to scale in size and speed, the testing of integrated circuitry will have to accommodate stricter constraints such as higher frequencies, smaller voltage levels, greater noise sensitivity and/or other the like. As a result, current socket design techniques can be expected to be a source of increased cost in next-generation circuit testing schemes.

BRIEF DESCRIPTION OF THE DRAWINGS

The various embodiments of the present invention are illustrated by way of example, and not by way of limitation, in the figures of the accompanying drawings and in which:

FIGS. 5A, 5B are cross-sectional diagrams each illustrating elements of a respective socket device according to a corresponding embodiment.

DETAILED DESCRIPTION

Figure 1:
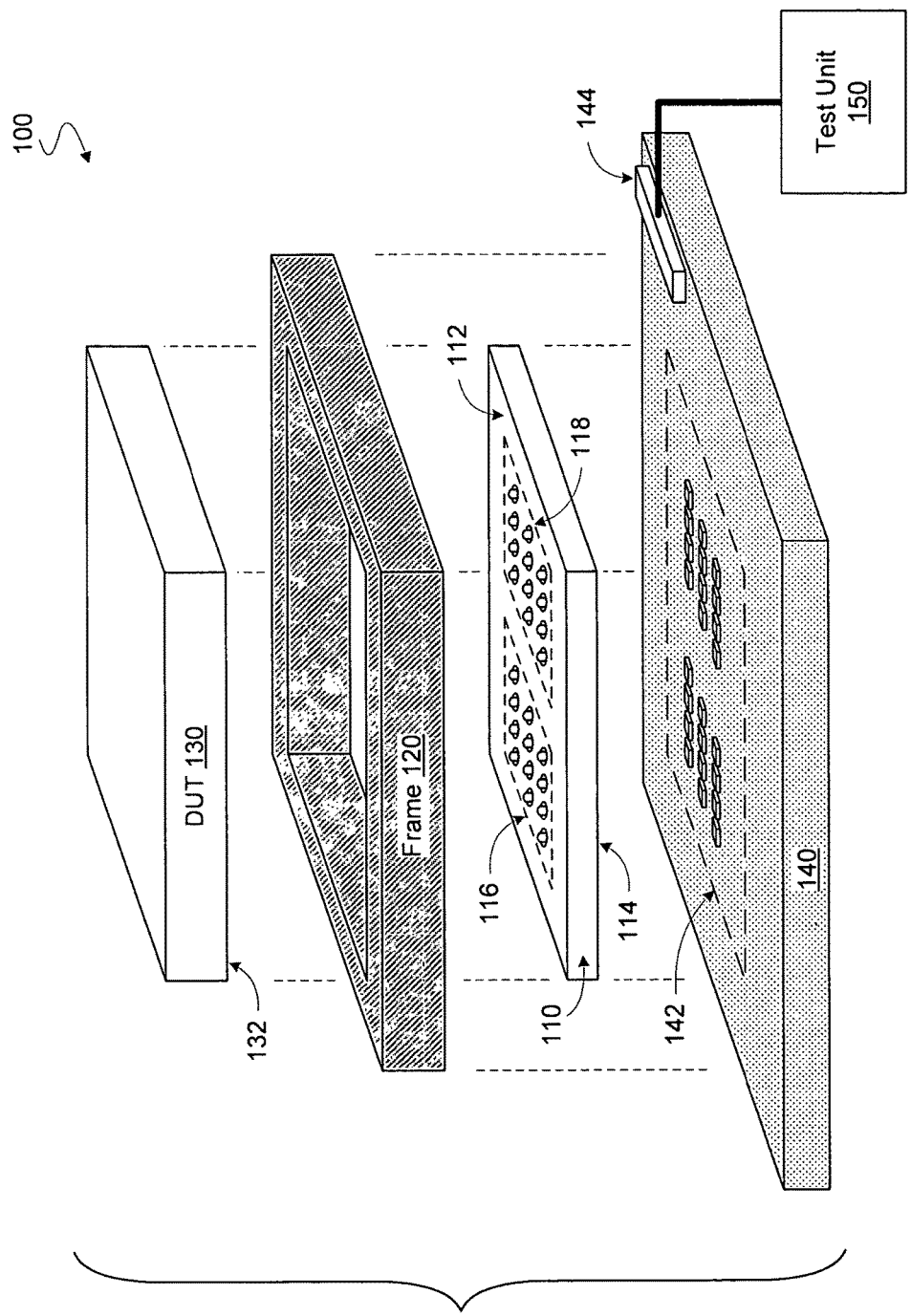
FIG. 1 is an exploded view of a system to provide coupling of integrated circuitry with a socket connector according to an embodiment.

Embodiments discussed herein variously include techniques or mechanisms for providing socket connector structures. Various embodiments exploit a concept of socket zones—e.g., implemented with modular socket sub-assemblies—that are distinguished from one another by one or more electrical and/or mechanical (electro-mechanical) characteristics. A socket connector—or portion thereof—may include a support structure (referred to herein as a "socket body") and pin interconnects variously extending in the socket body. The socket body may include a zone comprising an electro-mechanical characteristic—e.g., where another zone of the socket body, or a zone at another socket body of the socket connector, does not have that electro-mechanical characteristic. By way of illustration and not limitation, the electro-mechanical characteristic may include a presence of some instance of (or an absence of any instance of) an interconnect dimension, an interconnect material, an interconnect structure, a socket body material, a shielding structure and/or the like.

In some embodiments, a socket body comprises multiple distinct socket sub-assembly bodies coupled to each other directly and/or via a frame or other mounting hardware. The socket sub-assemblies may function as modules in the formation of a larger socket assembly—e.g., where a zone of one sub-assembly has one or more respective electro-mechanical characteristics that another zone (of the same sub-assembly or of another sub-assembly) does not have. Existing socket technologies do not contemplate a single socket connector variously accommodating different circuitry with such zones, much less with modular sub-assemblies having different respective ones of such zones. By contrast, some embodiment variously partition socket design into multiple zones (e.g., using distinct socket body sub-assemblies), where at least some zones are customized each to a specific performance need for one or more signals to be exchanged within that zone.

As compared to traditional test socket technology, some embodiments variously provide a low-cost solution to enable high speed input-output (HSIO) signal transmission during HVM product testing—e.g., by segregating interconnects for relatively high speed signals from other socket interconnects. Materials required to meet performance requirements for such high speed signals are more expensive than those used for other signal exchanges. Providing expensive materials for only some socket interconnects may reduce the cost significantly. Alternatively or in addition, some embodiments may simplify socket redesign. Where socket interconnects to accommodate different electrical performance requirements are segregated by zones, design decisions for such zones may be made are independent from each other. The designs for a given zone is smaller than that for the socket as a whole, reducing overall complexity in the designing/redesigning for each individual zone.

Certain features of various embodiments are described herein with reference to the use of a socket assembly to couple a device under test (DUT) to hardware that is to run a test of the DUT. However, such description may be extended to additionally or alternatively apply to any of a variety of other applications wherein a socket assembly is to couple to an IC device. The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices including a socket to couple an integrated circuit device (e.g., an IC chip or a packaged device) to a substrate of a PCB or other such device.

FIG. 1 shows an exploded view of a system 100 including socket connection hardware according to an embodiment. System 100 is one example of an embodiment that includes a socket device, wherein, of two given zones of the socket device, only one such zone has a particular electro-mechanical characteristic. System 100 may provide for testing of an integrated circuit device (for brevity, referred to herein as "device under test" or "DUT") using such a socket device. The DUT may be an IC die, for example, or a packaged device including such an IC die. In other embodiments, the socket device is to couple an IC device to a motherboard or other PCB for runtime operation of the IC device as a component of a hardware platform.

System 100 includes a socket body 110, a frame 120, and, in some embodiments, circuitry to be coupled thereto. By way of illustration, system 100 may further comprise some or all of a printed circuit board (PCB) 140, a test unit 150 and a device under test (DUT) 130 to be evaluated with test unit 150. Frame 120 is merely one example of mounting hardware that, in an embodiment, provides mechanical support for connecting DUT 130, at a side 132 thereof, to PCB 140 via socket body 110. Frame 120 may include structures adapted from any of a variety of conventional mechanisms for mounting a socket to a substrate.

As used herein "socket body" refers to a support structure for interconnects that variously extend at least partially through the support structure. A socket body may be a single contiguous support structure of a socket or, alternatively, an assembly (referred to herein as a "socket assembly body") of multiple constituent bodies (each referred to individually herein as a "socket sub-assembly body") for a socket. Unless otherwise indicated, socket body features described herein may pertain to any one of a socket sub-assembly body, a socket assembly body and a unitary socket body for a socket connector.

Socket body 110 may include a support structure (in some embodiments, comprising multiple sub-assembly bodies) through which extend a plurality of pins interconnects at least in part. Socket body 110 may comprise a substrate—e.g., including one or more layers of dielectric (and/or other) materials—to mechanically position pin interconnects at least partially therein. In some embodiments, the substrate has disposed therein one or more signal traces, circuit elements, printed circuit boards and/or other structures that, for example, are variously coupled between at least some of the pin interconnects. A substrate of socket body 110 may comprise any of various polymer materials—e.g., including Semitron® MP370 from Quadrant Plastics of Zurich, Switzerland—that are adapted from conventional socket connection techniques. In some embodiments, a substrate includes or has disposed therein an alloy or other metal (comprising copper or aluminum, for example) that aids in shielding of interconnect structures.

In the illustrative embodiment shown, some or all pin interconnects of the socket device extend from a side 112 of socket body 110 and at least partially toward an opposite side 114 of socket body 110. Socket body 110 may be secured by frame 120 to a surface region 142 of PCB 140 having disposed therein or thereon conductive contacts for coupling to respective ones of the pin interconnects. Such conductive contacts may allow for signal exchanges—e.g., via PCB 140 and a connector 144 coupled thereto—between the socket device and test unit 150. Such signal exchanges may enable test unit 150 to evaluate functionality of DUT 130. In another embodiment, system 100 omits test unit 150—e.g., where connector 144 is an input/output port of system 100 and where DUT 100 is instead an integrated circuit device that is to participate in runtime operation of system 100 while coupled to PCB 140 via socket body 110.

Pin interconnects may variously extend in respective zones of socket body 110—e.g., including the illustrative zones 116, 118—that have different electro-mechanical characteristics. Unlike conventional socket designs, a multi-zoned socket architecture according to an embodiment comprises or otherwise allows for various electro-mechanical characteristics to be segregated—e.g., horizontally in a plane extending parallel to sides 112, 114—into different respective zones of a socket body. Socket zones (for brevity, also referred to herein simply as "zones") may provide for segregation of electrical interconnections that meet different electrical performance requirements for signal communication. By way of illustration and not limitation, zones of a socket device may vary from each other with respect to one or more of an interconnect type, a substrate material type, a presence or absence of a particular type of interconnect shielding structure and/or the like. Some or all such zones may each comprise, for example, a respective structurally distinct sub-assembly module that is to make up a socket body assembly. A socket sub-assembly may comprise a sub-assembly body and electrical interconnects (e.g., pin interconnects). In some embodiments, a socket sub-assembly further comprises, or is configured to couple to, one or more alignment pins, bushings and/or other structures that are to aid mechanical alignment between sub-assemblies.

Examples of electro-mechanical characteristics that may distinguish one socket zone from another socket zone include a value (or range of values) for a dimension, or combination of dimensions, of respective pin interconnects. By way of illustration and not limitation, all pin interconnects of a given zone may have the same value (or be in the same range of values) for a width, length, cross-sectional area and/or other geometric characteristic—e.g., where that value (or range of values) does not apply with respect to a corresponding geometric characteristic for any pin interconnects of at least some other zone. Alternatively or in addition, all pin interconnects of a given zone may have the same conductive (or other) material, where pin interconnects of another zone instead have a different material. In some embodiments, zones have different respective types of pin interconnect structures—e.g., where two or more zones include different respective ones of pogo pins, stamped pins, elastomer pin and/or any of various other pin interconnect types.

Socket zones may be distinguished from one another by any of a variety of additional or alternative electro-mechanical characteristics, according to different embodiments. Other examples of such characteristics include a material of a socket body, a thickness of the socket body, compositional layers that make up the socket body and/or structures formed by a surface of the socket body. For example, a socket body or portion thereof (for brevity, referred to herein as a "socket body portion") for one zone may comprise, form or otherwise accommodate a shielding structure such as an air gap, a metal core, etc.—e.g., where a socket body portion of a different zone has a structurally and/or materially different shielding, or no shielding.

In some embodiments, a socket body portion of one zone may have disposed therein structures that variously loop signals back to the same side of from which the signals were received by socket body portion. By contrast, structures disposed in a socket body portion of another zone may instead pass signals between opposite sides of that socket body portion. Alternatively or in addition, socket zones may variously provide for respective signal loopbacks via different types of signal path structures, circuit elements and/or the like.

Different electro-mechanical characteristics of socket zones may allow for different respective types of signals to be exchanged via such zones. For example, of two given zones of a socket device according to an embodiment, only one such zone may be configured to participate in a particular type of exchange with a DUT. The exchange may be to provide a supply voltage, for example, and/or signals of a particular signal type—e.g., one of a data signal type, clock signal type, address signal type, command signal type, control signal type or the like.

Figure 2:
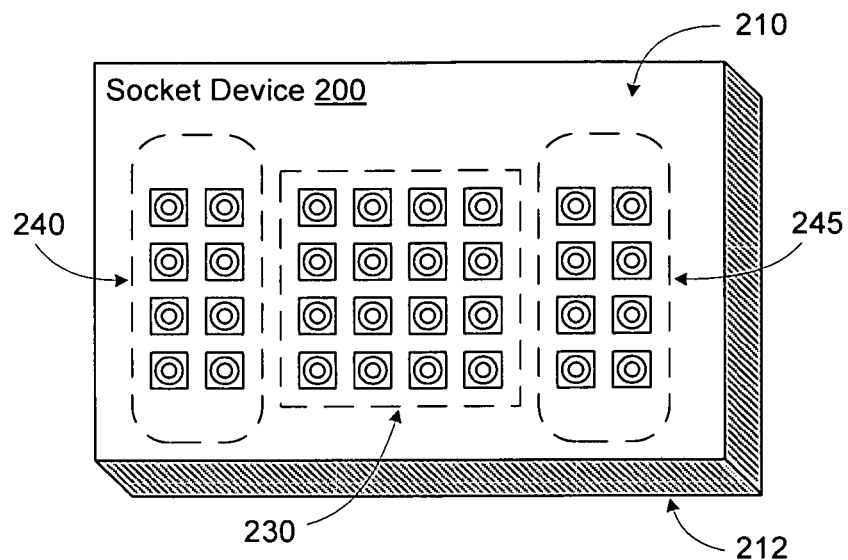
FIG. 2 is a functional block diagram illustrating elements of a socket device according to an embodiment.

FIG. 2 shows a socket device 200, according to an embodiment, including structures to interconnect an integrated circuit device with a substrate such as that of a printed circuit board. Socket device 200 may include some or all of the features of a socket device including socket body 110, for example.

As shown in FIG. 2, socket device 200 may include a socket body forming sides 210, 212, wherein pin interconnects variously extend at least partially in the socket body. The socket body may form a substantially planar substrate that, for example, is between 0.5 millimeters (mm) and 5.0 mm in thickness between sides 210, 212. Such a planar substrate may additionally or alternatively have a width or a length that is between 20 mm and 200 mm, for example. In one illustrative embodiment, a thickness of a socket body is within a range between 3 mm to 5 mm and/or a length (or width) of the socket body is within a range of 120 mm to 150 mm. However, some or all of these socket body dimensions may vary widely according to implementation-specific details, and may not be limiting on some embodiments.

Socket device 200 may be a modular socket sub-assembly that can be combined with one or more other socket sub-assemblies to form a larger device that functions as a socket connection. In another embodiment, socket device 200 includes a single unitary socket body for an entire socket connector. For example, a total number of pin interconnects extending to side 210 may be equal to a particular number of I/O contacts of an IC device that is to couple to the socket connector—e.g., the total number of I/O contacts of the IC device, the total number of I/O contacts that are disposed on one side of an IC device, or the total number of I/O contacts disposed on one side of the IC device that are to be used for testing of the IC device.

Socket device 200 is one example of an embodiment including two or more zones—e.g., including the illustrative zones 230, 240, 245—where pluralities of pin interconnects variously extend each in a different respective one of such zones. Zones 230, 240, 245 may each include a respective portion of side 210 and may variously extend through the socket body to include a respective portion of side 212. Of two given zones of the multiple zones 230, 240, 245, only one zone may have a particular electro-mechanical characteristic. One or more other electro-mechanical characteristics may be common to the two zones, and may even be common to all zones of socket device 200. The configuration of zones 230, 240, 245—e.g., including the total number of zones 230, 240, 245, the particular arrangement of zones 230, 240, 245 relative to one another, and the particular number and arrangements of respective pin interconnects comprising zones 230, 240, 245—is merely illustrative and not limiting on some embodiments. Socket device 200 may include more, fewer and/or differently configured zones, according to various embodiments.

Different socket zones may be disposed, for example, on opposite sides of a straight line extending on one of sides 210, 212. For example, two such zones may be on opposite sides of a plane that extends, orthogonally to sides 210, 212, through the socket body of socket device 200. A cross-section of one zone may be within a closed loop, where respective cross-sections of one or more zones are outside of that closed loop. In an embodiment, two or more zones have respective rectilinear, non-overlapping cross-sectional areas. For example, the pin interconnects of a zone may all be arranged in a single row or, alternatively, arranged in a contiguous two-dimensional array. In some embodiments, a zone includes more than four (e.g., eight or more) pin interconnects.

Figure 3:
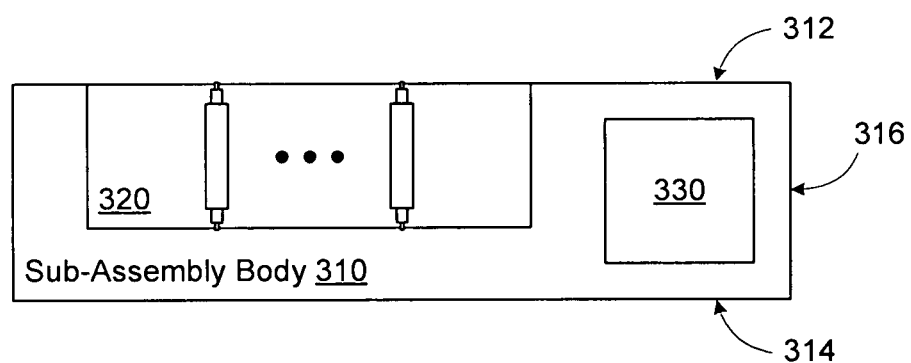
FIG. 3 is a hybrid cross-sectional view and functional block diagram illustrating elements of a socket sub-assembly according to an embodiment.

FIG. 3 shows a cross-sectional view of a sub-assembly module 300 including interconnect structures according to another embodiment. Sub-assembly module 300 may include some or all features of socket device 200 or a socket device including socket body 110, for example. Sub-assembly module 300 is one example of a socket device, according to an embodiment, that can be combined with one or more other socket devices to form an assembly that is to serve as a socket connection.

In the illustrative embodiment shown, sub-assembly module 300 includes a sub-assembly body 310 (e.g., a portion of socket body 110) and a pin block 320 comprising multiple interconnects that variously extend each from a side 312 of sub-assembly body 310 at least partially toward an opposite side 314 of sub-assembly body 310. To facilitate assembly with one or more other sub-assembly modules, sub-assembly module 300 may further include one or more structures—e.g., including the illustrative coupling structure 330—to couple sub-assembly module 300 directly or indirectly to another socket sub-assembly module. By way of illustration and not limitation, coupling structure 330 may include a lip portion formed at a side 316 of sub-assembly body 310, the lip structure to overlap a corresponding lip portion of another sub-assembly module for edgewise coupling. Alternatively or in addition, coupling structure 330 may include a through-hole extending through a part of sub-assembly body 310, the through-hole to accommodate a pin or other alignment structure. Coupling structure 330 may include any of a variety of additional or alternative structures—e.g., including, but not limited to, a clasp, clip, tab, or other such structure—for sub-assembly module 300 to align with, interlock with and/or mechanically secure to a corresponding connector of another socket sub-assembly module.

Coupling structure 330 may facilitate coupling of sub-assembly module 300 to another sub-assembly module (not shown), wherein a zone including pin block 320 has one or more electro-mechanical characteristics that a zone of the other sub-assembly module does not have. In some embodiments, pin block 320 includes two (or more) constituent sub-zones that are distinguished from one another at least with respect to some electro-mechanical characteristic. In facilitating the routing of signals in distinct zones (e.g., of distinct socket sub-assemblies), socket devices such as socket device 200 or sub-assembly module 300 variously aid the utilization of different materials, short pins, shielding design, routing and/or the like. By contrast, conventional techniques use the same electro-mechanical characteristics across all signals of a unitary socket architecture, resulting in additional socket design time, higher socket cost and/or lower socket performance.

Figure 4:
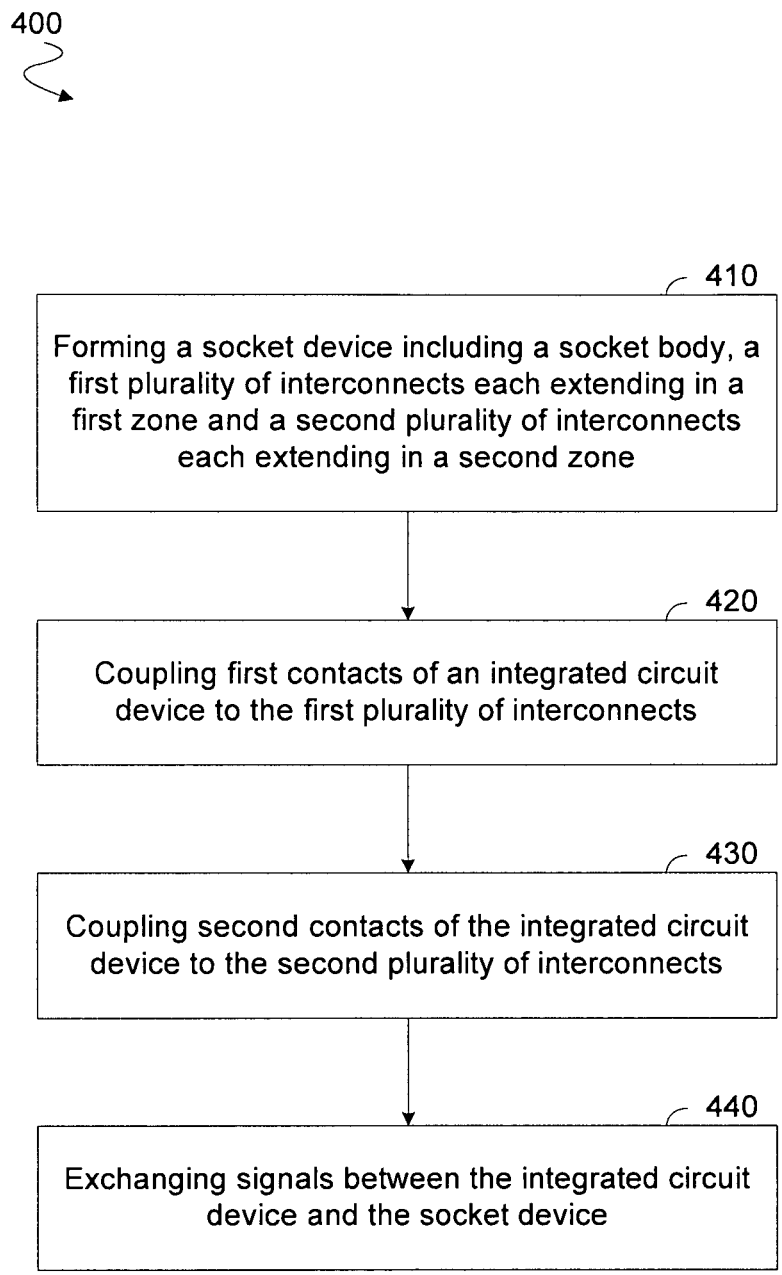
FIG. 4 is a flow diagram illustrating elements of a method for providing connection with a socket device according to an embodiment.

FIG. 4 shows features of a method 400 to provide interconnection with integrated circuitry via a socket device according to an embodiment. Method 400 may include operations to manufacture and/or use (e.g., couple and/or exchange signals with) a socket device including socket body 110, socket device 200 or sub-assembly module 300, for example.

In some embodiments, method 400 includes fabrication processing to form a socket device that, for example, includes a unitary socket body or, alternatively, an assembly of modules each including a different respective socket sub-assembly body. Such processing may include, at 410, forming a socket device including a socket body, a first plurality of interconnects each extending in a first zone of the socket body and a second plurality of interconnects each extending in a second zone of the socket body. The zones may be located in different respective socket sub-assemblies, for example. In other embodiments, method 400 omits, and is performed after, fabrication processing such as that at 410.

Method 400 may further comprise operations to couple an integrated circuit device to the socket device. By way of illustration and not limitation, 400 may further comprise, at 420, coupling first contacts of the integrated circuit device to the first plurality of interconnects. At 430, method 400 may further include coupling second contacts of the integrated circuit device to the second plurality of interconnects. The integrated circuit device may be an IC die or a packaged device including one or more IC dies. After the coupling at 420 and 430, method 400 may, at 440, exchange signals between the integrated circuit device and the socket device. Based on the signals exchanged at 440, the integrated circuit may be evaluated by a test logic such as that of test unit 150—e.g., where such evaluation includes operations adapted from conventional techniques.

Of the first zone and the second zone, only one of the zones—e.g., the first zone—may have a first electro-mechanical characteristic. The first electro-mechanical characteristic may include a characteristic other than the mere location of an interconnect structure and/or the mere location of a socket body portion. The first electro-mechanical characteristic may also include a characteristic other than merely a total number of instances of a type of interconnect structure. For example, two socket zones may be distinguished from one another by at least some non-trivial difference between the dimensions and/or the materials of their respective interconnects or socket body portions (e.g., where such a difference is not merely due to incidental variation during fabrication).

By way of illustration and not limitation, the first electro-mechanical characteristic may be selected from a group that, for example, consists of an interconnect dimension, an interconnect material, an interconnect structure, a socket body material and a shielding structure. The first electro-mechanical characteristic may include an interconnect dimension where, for example, respective pin interconnects of two zones vary from one another in length, width and/or breadth. Two zones may each include respective instances of a pin interconnect type (e.g., pogo pins), wherein such zones differ at least with respect to one or more dimensions of such pin interconnects. In an illustrative scenario according to one embodiment, the first zone may be associated with a first parameter value—and/or a first range of parameter values—that pertains to instances of a given pin interconnect structure in that first zone. The parameter value may describe or otherwise indicate, for example, some or all of a length, width, breadth, cross-sectional area and/or volume of a pin interconnect structure. The first value may include a statistical value (e.g., an average, a mean, etc.) that is based on multiple instances of the given pin interconnect structure. In such an embodiment, a corresponding second parameter value (or a second range of parameter values) may pertain to instances of a similar pin interconnect structure in the second zone. However, a difference between the second parameter value and the first parameter value may be larger than any incidental difference that might be attributable, for example, to mere variation during processing. At least in this respect, the second zone may be said to lack an electro-mechanical characteristic of the first zone.

For example, an average volume of pin interconnect structures in the first zone may differ by at least ten percent (10%) from an average volume of corresponding pin interconnect structures in the second zone. Such average volumes may differ by 20% or more (e.g. by at least 50%), in some embodiments. Alternatively or in addition, an average linear dimension (e.g., width or length) of a pin interconnect structure may vary between the two zones by at least five percent (5%). Such average linear dimensions may differ by 10% or more (e.g. by at least 20%), for example. In some embodiments, the respective average lengths of corresponding pin interconnect structures may vary between two zones by at least forty percent (40%). In this context, "length" refers to a distance as measured between opposite sides of a socket body (e.g., between sides 210, 212 or between sides 312, 314), where "width" and "breadth" are dimensions orthogonal to each other and to a length dimension. In some embodiments, one or more characteristics (e.g., the total number of pin interconnects in a zone, a linear dimension of a zone) vary between two zones by one or more orders of magnitude.

The first electro-mechanical characteristic may include an interconnect material where, for example, a conductor, alloy or other substance (e.g., including one or more of copper, gold, nickel, beryllium, etc.) is used to make pin interconnects and/or other interconnect structure of one zone, but where some other zone uses an alternative material for otherwise similar pin interconnects and/or other interconnect structure. The first electro-mechanical characteristic may include an interconnect structure where, for example, one zone includes one or more instances of a type of pin interconnect and/or other interconnect structure, but where another zone lacks any instance of that type of pin interconnect and/or other interconnect structure. For example, two zones may be distinguished from one another by the presence/absence of a spring, bend and/or other component of pin interconnects. In an embodiment, socket zones include different respective interconnect types—e.g., different respective ones of a pogo pin interconnect type, a stamped pin interconnect type, an elastomer pin interconnect type and any of various other interconnect types.

Additionally or alternatively, zones may be distinguished from one another with respect to different types of signal paths variously extending therein. One such signal path type may include a signal path that is to merely to pass a signal between opposite sides of a socket body portion. Another signal path type may include a signal path that is to loop a signal back to the same side of a signal body portion from which such signals were received. In some embodiments, a signal path type includes a signal path that, additionally or alternatively, includes a particular type of one or more circuit elements disposed in a socket body portion. Such one or more circuit elements—e.g., including a capacitor—may be variously disposed in or on a printed circuit board that is integrated with (disposed at least partially in) a socket body portion. The first electro-mechanical characteristic may include a shielding structure where, for example, zones are distinguished from one another with respect to the presence of a type of air gap, metal core and/or other such structure to reduce signal noise.

In one embodiment, the first electro-mechanical characteristic may be selected from a group consisting of the interconnect dimension, the interconnect material, the interconnect structure and the shielding structure. For example, the first electro-mechanical characteristic may be selected, more particularly, from the group consisting of the interconnect dimension, the interconnect material and the interconnect structure. Alternatively, the first electro-mechanical characteristic may be selected from the group consisting of the socket body material and the shielding structure.

FIG. 5A illustrates features of a socket assembly 500 to couple to integrated circuitry according to an embodiment. Socket assembly 500 may include features of various other socket assemblies described herein. In an embodiment, manufacture and/or use of socket assembly 500 includes one or more operations of method 400. Socket assembly 500 is one example of a socket device that includes multiple socket sub-assemblies coupled to one another—e.g., directly and/or via a frame or other mounting hardware—to provide a socket connector. The base connector may facilitate coupling of integrated circuitry (e.g., an IC chip or a packaged device) to a substrate of a PCB or other device. Socket assembly 500 may include sub-assembly module 300, for example.

In the example embodiment shown, socket assembly 500 includes socket sub-assemblies 510, 520 that comprise respective socket bodies 516, 524. Socket sub-assemblies 510, 520 are coupled to one another via respective coupling structures at a region 530. For example, socket bodies 516, 524 may form respective lip structures that overlap each other in region 530, wherein a pin 532 extends through alignment holes formed in such lip structures.

Socket sub-assemblies 510, 520 may form, on opposite sides of region 530, respective zones that differ from one another at least with respect to one electro-mechanical characteristic. By way of illustration and not limitation, socket sub-assembly 510 may include pogo pins 512 that extend between opposite sides of a metal core of socket body 516, where the metal core is disposed between exterior layers of an insulator 514 (e.g., a plastic). By contrast, socket body 524 may omit any such metal core, where pogo pins 522 are provided relatively less shielding, as compared to that provided for pogo pins 512. Alternatively or in addition, one or more dimensions of pogo pins 512 (e.g., including a width and/or a breadth) may be different than a corresponding one or more dimensions of pogo pins 522. In some embodiments, socket body 516 variously forms air gaps 518 around pogo pins 512, where no such air gaps are provided by socket body 524. The different electro-mechanical characteristics shown for zones of socket assembly 500 are merely illustrative of one embodiment. Other embodiments may variously provide fewer, more and/or other differences between respective electro-mechanical characteristics of socket sub-assemblies 510, 520.

FIG. 5B illustrates features of a socket device 550 to couple to integrated circuitry according to another embodiment. Socket device 550 is one example of a socket connector that includes zones having different respective electro-mechanical characteristics. For example, socket device 550 may include features of socket device 200, socket sub-assembly module 300 or socket assembly 500. A manufacturing and/or use of socket device 550 may include operations of method 400.

Socket device 550 includes a socket body 560 (e.g., comprising a unitary socket body structure or, alternatively, an assembly of socket body sub-assemblies) and interconnects variously extending from a side 562 of socket body 560 and at least partially toward an opposite side 564. Zones 570, 580 of socket device 550 may be distinguished from one another by respective types of pin interconnects that, for example, are of different lengths (as measured along a line of direction that is orthogonal to sides 562, 564).

In the illustrative embodiment shown, zones 570, 580 include respective PCBs 572, 582 variously disposed in socket body 560 at different levels between sides 562, 564. Loop back signal paths via PCB 572 may thus be shorter than loop back signal paths via PCB 582. PCB 572 may provide for a loopback signal path that includes one or more circuit components (e.g., including the illustrative capacitor 574)—e.g., in addition to another loopback signal path that omits any such one or more circuit components. Alternatively or in addition, PCB 582 may provide for a loopback signal path that includes a different one or more circuit components and, for example, another loopback signal path that has no such circuit component(s). Accordingly, zones 570, 580 may be distinguished from one another additionally or alternatively by respective types of signal paths.

Figure 6A:
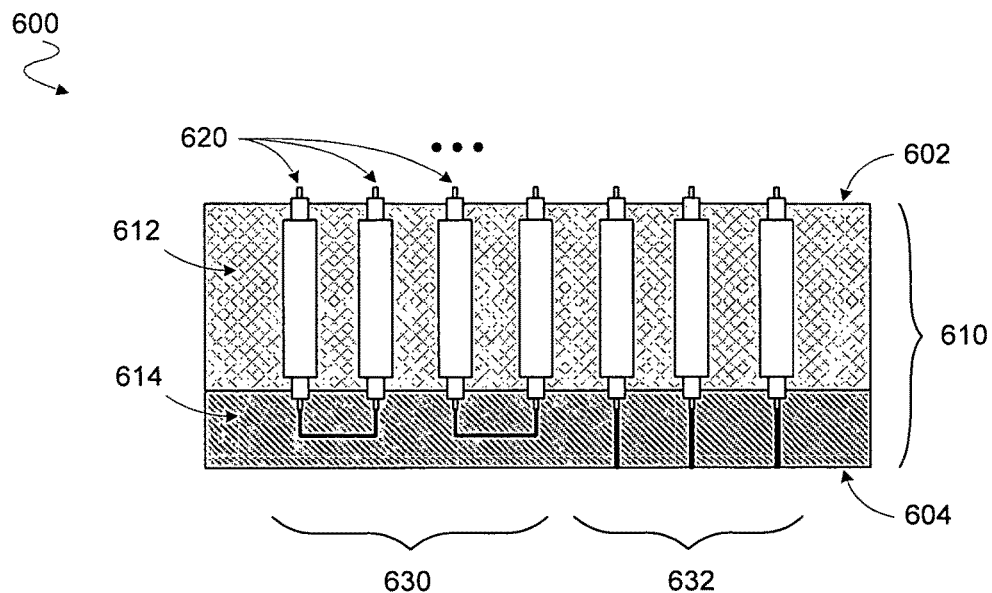
FIGS. 6A, 6B are cross-sectional diagrams each illustrating elements of a respective socket device according to a corresponding embodiment.

FIG. 6A shows a socket device 600 to interconnect with integrated circuitry according to another embodiment. Socket device 600 may include features of socket device 500 or any of various other socket devices described herein, for example. Although certain embodiments are not limited in this regard, socket device 600 may be a socket sub-assembly module.

Socket device 600 includes a socket body 610 and pin interconnects 620—e.g., including pogo pin interconnects—variously extending from a side 602 of socket body 610 and at least partially toward an opposite side 604. Zones 630, 632 of socket device 600 may be distinguished from one another by respective types of signal paths variously provided by respective ones of pin interconnects 620. For example, socket body 610 may include a layer 612 of a plastic (or other) material and a printed circuit board 614 extending under layer 612. A portion of printed circuit board 614 that comprises zone 630 in part may include conductive traces to interconnect respective ones of pin interconnects 620. Accordingly, such conductive traces may provide for a loopback of signals received at socket device 600 via side 602. In such an embodiment, another portion of printed circuit board 614, comprising part of zone 632, may instead include pass-through traces that provide for signals to be communicated between sides 602, 604. Accordingly, an electro-mechanical characteristic applicable to only one of zones 630, 632 may include a presence (or absence) of a pass-through type of signal path (or alternatively, a loop-back type of signal path).

Figure 6B:
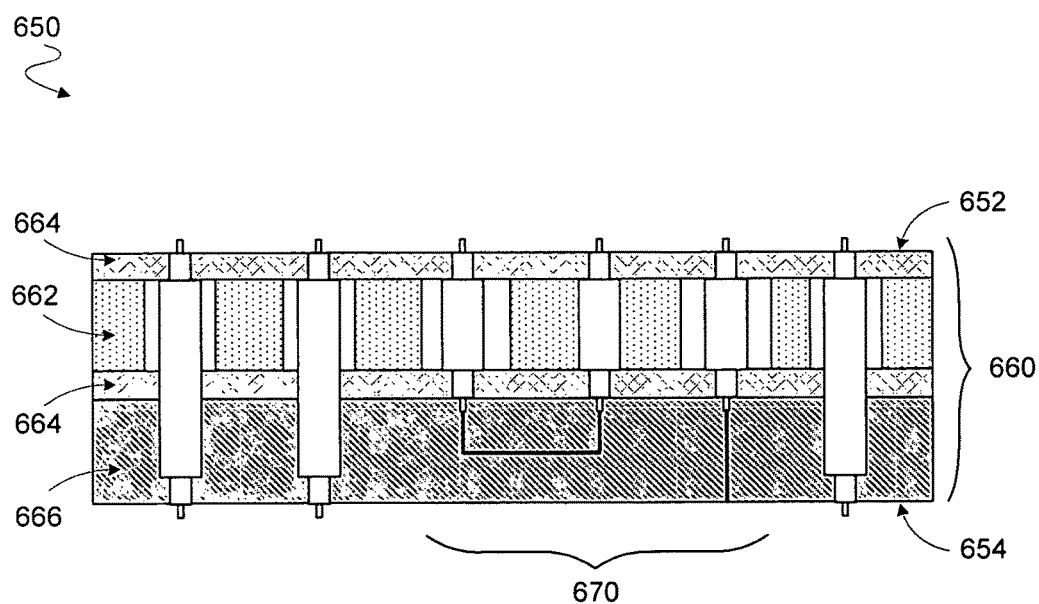

FIG. 6B shows a socket device 650 comprising zones that have different respective electro-mechanical characteristics according to another embodiment. Socket device 650 may include features of one of socket devices 500, 600 or any of various other socket devices described herein. Socket device 650 includes a socket body 660 and pin interconnects that variously extend at least partially between opposite side 652, 654 of socket body 660. A zone 670 of socket device 650 may be distinguished from some or all of the rest of socket device 650—e.g. at least insofar as zone 670 includes relatively short pin interconnects.

In the illustrative embodiment shown, socket body 660 includes a printed circuit board 666, plastic layers 664 and a metal layer 662 disposed between plastic layers 664. Pin interconnects in zone 670 may extend only partially through socket body 660 to variously couple to respective signal traces formed in printed circuit board 666. By contrast, pin interconnects outside of zone 670 may extend through printed circuit board 666 and, for example, to each of sides 652, 654. Additionally or alternatively, metal layer 662 provide signal shielding both for pin interconnects within zone 670 and for other pin interconnects of socket device 650.

Figure 7:
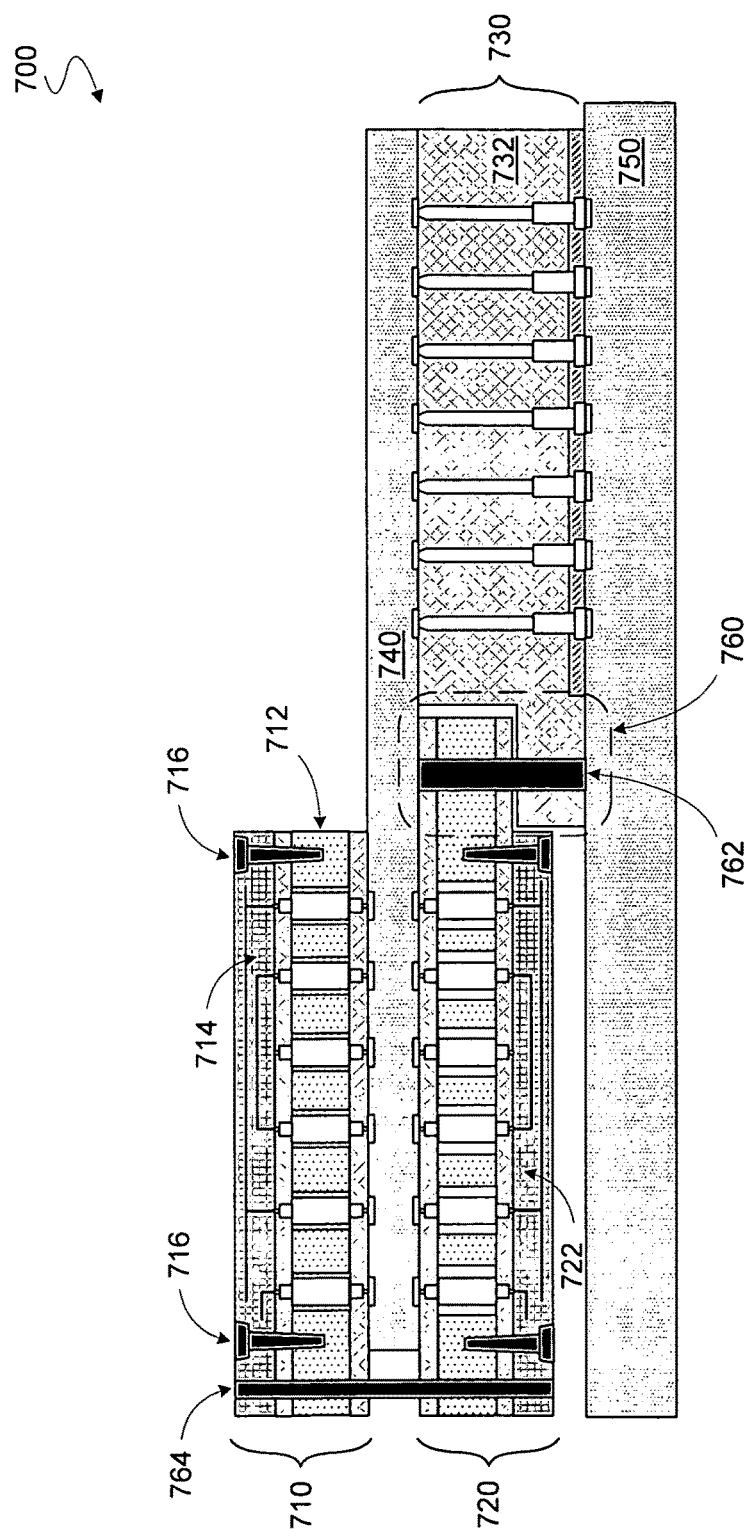
FIG. 7 is a cross-sectional diagram illustrating elements of a system to test integrated circuitry with a socket device according to an embodiment.

FIG. 7 illustrates features of a system 700 to test integrated circuitry according to an embodiment. System 700 may include some or all of the features of system 100, for example. System 700 may include (or alternatively, couple to) a DUT 740 that is to be evaluated with a test unit (not shown) coupled to DUT 740 via a PCB 750 and one or more socket devices of system 700.

In the illustrative embodiment shown, system 700 includes a socket device 710 coupled at one side of DUT 740, and another socket device—e.g., a socket assembly comprising the illustrative socket sub-assemblies 720, 730—coupled at an opposite side of DUT 740. Such socket devices may variously provide for signals to be exchanged between DUT 740 and PCB 750—e.g., via signal paths of socket sub-assembly 730 and/or other signal paths (not shown). The particular configuration of first socket device 710 and socket sub-assemblies 720, 730—relative to one another and to DUT 740—is merely illustrative, and not limiting on various embodiments.

Although certain embodiments may not be limited in this regard, pin interconnects of socket device 710 may variously extend, at least in part, through a socket body that includes, for example, a metal layer 712 and a printed circuit board 714. Printed circuit board 714 may surrounded, in two dimensions or three dimensions, by other structure of the socket body, in some embodiments. Fasteners 716 may be include in or couple to socket device 710 to secure components of the socket body to one another, to DUT 740, to a socket frame (not shown) and/or other structure of system 700. Coupling structures may additionally or alternatively include, for example, a hole, extending through the socket body of device 710, to accommodate an alignment pin 764.

Socket sub-assemblies 720, 730 may be coupled to one another via respective coupling structures at a region 760. For example, the bodies of sub-assemblies 720, 730 may form respective lip structures that overlap each other in region 760, wherein a pin 762 extends through alignment holes formed in such lip structures. Socket sub-assemblies 720, 730 may form, on opposite sides of region 760, respective zones that differ from one another at least with respect to one electro-mechanical characteristic. For example, respective pin interconnects of sub-assemblies 720, 730 may differ by type and/or otherwise may differ with respect to physical dimensions. In the illustrative embodiment shown, socket sub-assembly 720 includes pogo pins of a relatively short length, whereas socket sub-assembly 730 includes stamped pins which are relatively long. Additionally or alternatively, sub-assemblies may differ from one another with respect to the presence (or absence) of a socket body thickness, a socket body material, a shielding structure and/or the like. By way of illustration and not limitation, a relatively thin body 722 of socket sub-assembly 720 may be suspended above PCB 750 by a relatively thick socket sub-assembly 730. Socket device 710 may additionally or alternatively include one or more zones that differ, with respect to one or more electro-mechanical characteristics, from a zone of sub-assembly 720 and/or from a zone of sub-assembly 730.

Figure 8:
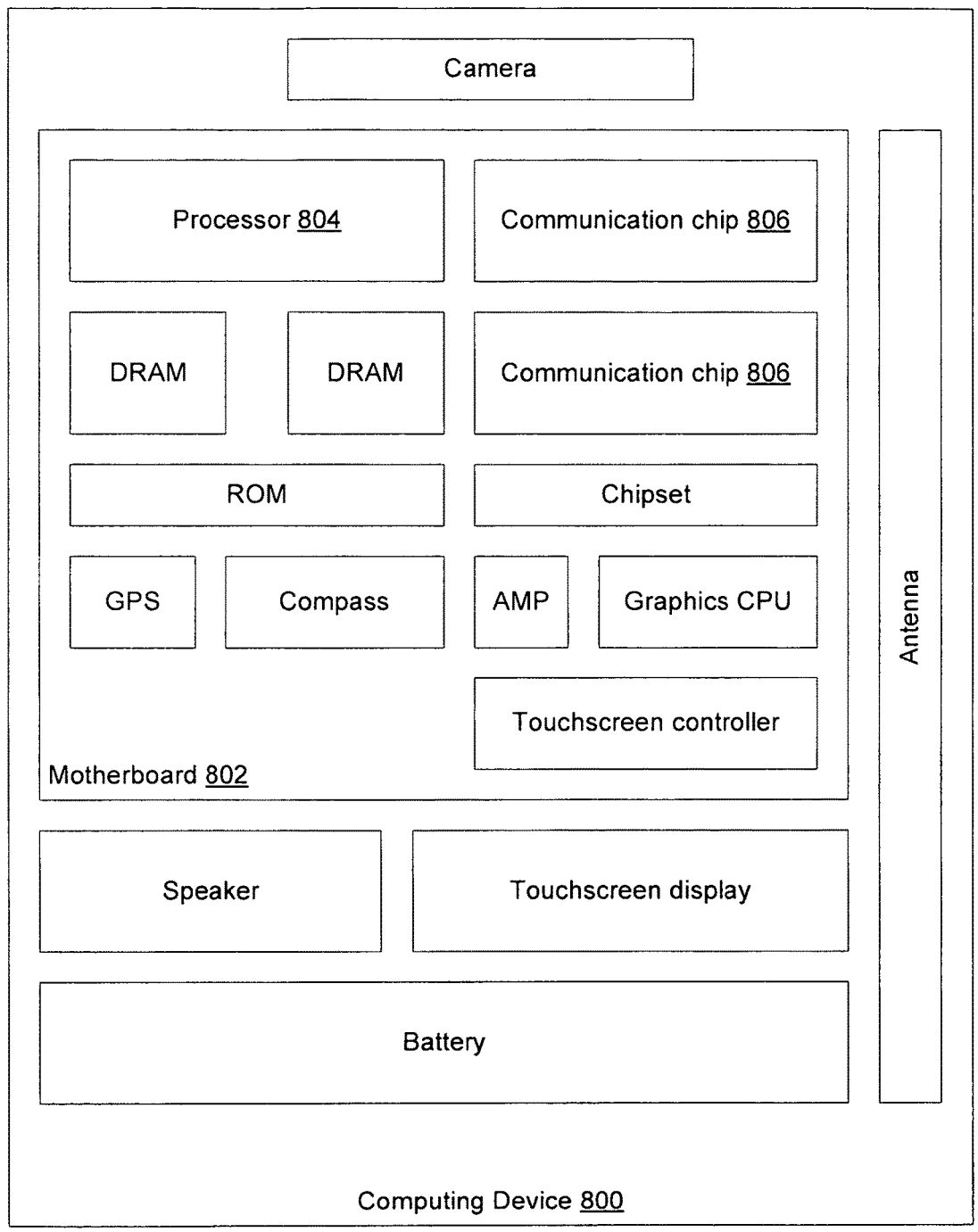
FIG. 8 illustrates a computing device in accordance with one embodiment.

FIG. 8 illustrates a computing device 800 in accordance with one embodiment. The computing device 800 houses a board 802. The board 802 may include a number of components, including but not limited to a processor 804 and at least one communication chip 806. The processor 804 is physically and electrically coupled to the board 802. In some implementations, the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touch-screen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. The term "processor" may refer to any device or portion of a device that processes electronic data from registers and/or memory to transform that electronic data into other electronic data that may be stored in registers and/or memory. The communication chip 806 also includes an integrated circuit die packaged within the communication chip 806.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 9:
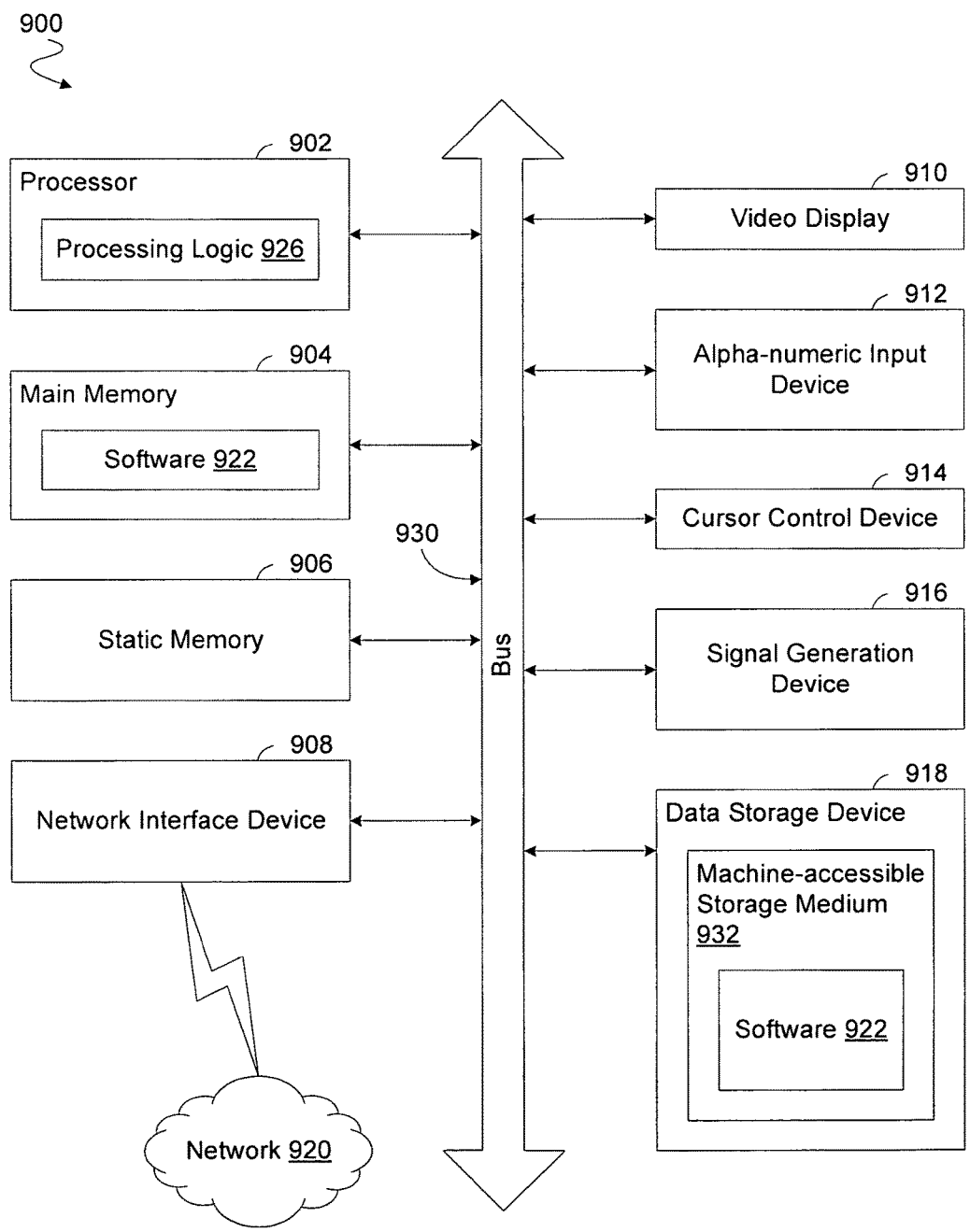
FIG. 9 illustrates a block diagram of an exemplary computer system, in accordance with an embodiment.

FIG. 9 illustrates a diagrammatic representation of a machine in the exemplary form of a computer system 900 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 900 includes a processor 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a secondary memory 918 (e.g., a data storage device), which communicate with each other via a bus 930.

Processor 902 represents one or more general-purpose processing devices such as a microprocessor, central processing unit, or the like. More particularly, the processor 902 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 902 may also be one or more special-purpose processing devices such as an application specific integrated circuit (ASIC), a field programmable gate array (FPGA), a digital signal processor (DSP), network processor, or the like. Processor 902 is configured to execute the processing logic 926 for performing the operations described herein.

The computer system 900 may further include a network interface device 908. The computer system 900 also may include a video display unit 910 (e.g., a liquid crystal display (LCD), a light emitting diode display (LED), or a cathode ray tube (CRT)), an alphanumeric input device 912 (e.g., a keyboard), a cursor control device 914 (e.g., a mouse), and a signal generation device 916 (e.g., a speaker).

The secondary memory 918 may include a machine-accessible storage medium (or more specifically a computer-readable storage medium) 932 on which is stored one or more sets of instructions (e.g., software 922) embodying any one or more of the methodologies or functions described herein. The software 922 may also reside, completely or at least partially, within the main memory 904 and/or within the processor 902 during execution thereof by the computer system 900, the main memory 904 and the processor 902 also constituting machine-readable storage media. The software 922 may further be transmitted or received over a network 920 via the network interface device 908.

While the machine-accessible storage medium 932 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

Figure 10:
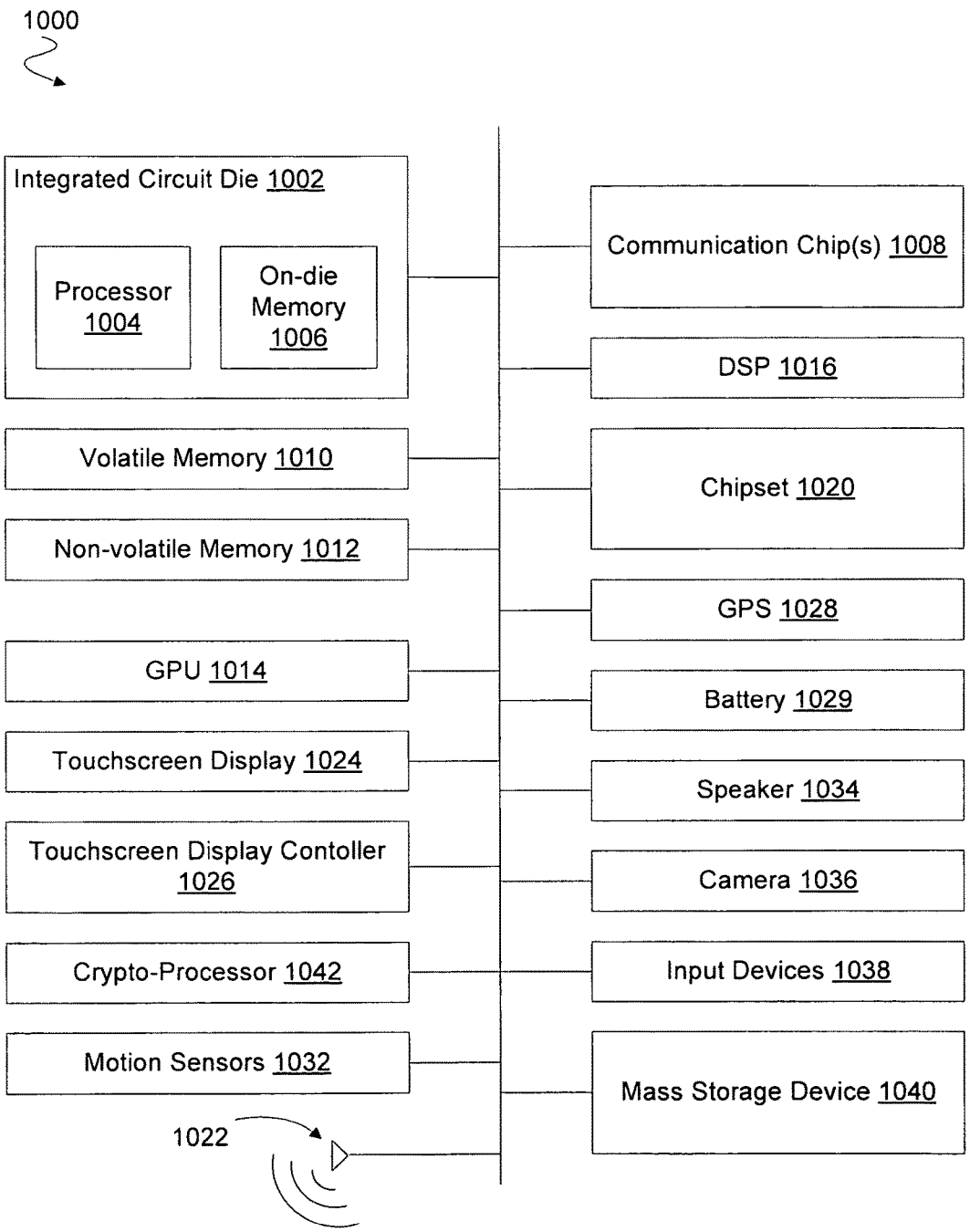
FIG. 10 is a computing device built in accordance with an embodiment.

FIG. 10 illustrates a computing device 1000 in accordance with one embodiment. The computing device 1000 may include a number of components. In one embodiment, these components are attached to one or more motherboards. In an alternate embodiment, these components are fabricated onto a single system-on-a-chip (SoC) die rather than a motherboard. The components in the computing device 1000 include, but are not limited to, an integrated circuit die 1002 and at least one communication chip 1008. In some implementations the communication chip 1008 is fabricated as part of the integrated circuit die 1002. The integrated circuit die 1002 may include a CPU 1004 as well as on-die memory 1006, often used as cache memory, that can be provided by technologies such as embedded DRAM (eDRAM) or spin-transfer torque memory (STTM or STTM-RAM).

Computing device 1000 may include other components that may or may not be physically and electrically coupled to the motherboard or fabricated within an SoC die. These other components include, but are not limited to, volatile memory 1010 (e.g., DRAM), non-volatile memory 1012 (e.g., ROM or flash memory), a graphics processing unit 1014 (GPU), a digital signal processor 1016, a crypto processor 1042 (a specialized processor that executes cryptographic algorithms within hardware), a chipset 1020, an antenna 1022, a display or a touchscreen display 1024, a touchscreen controller 1026, a battery 1029 or other power source, a power amplifier (not shown), a global positioning system (GPS) device 1028, a compass 1030, a motion coprocessor or sensors 1032 (that may include an accelerometer, a gyroscope, and a compass), a speaker 1034, a camera 1036, user input devices 1038 (such as a keyboard, mouse, stylus, and touchpad), and a mass storage device 1040 (such as hard disk drive, compact disk (CD), digital versatile disk (DVD), and so forth).

The communications chip 1008 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1008 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1008. For instance, a first communication chip 1008 may be dedicated to shorter range wireless communications such as Wi-Fi and Bluetooth and a second communication chip 1008 may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory. In various embodiments, the computing device 1000 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

In one implementation, a socket sub-assembly device comprises a first sub-assembly body, a first plurality of interconnects, each extending in the first sub-assembly body, to couple to first contacts at a first side of an integrated circuit device, wherein, of all contacts at the first side, the socket sub-assembly device to directly couple only to a subset of the contacts, and a first connector structure formed in or on the socket sub-assembly body, the first connector structure configured to couple the socket sub-assembly device to another socket sub-assembly device to form at least part of a socket assembly including a first zone comprising the first plurality of interconnects and a second zone including a second plurality of interconnects. Of the first zone and the second zone, only the first zone has a first electro-mechanical characteristic selected from the group consisting of an interconnect dimension, an interconnect material, an interconnect structure, a socket body material, and a shielding structure.

In an embodiment, the other socket sub-assembly device includes a second sub-assembly body, and wherein the first connector structure is configured to couple the socket sub-assembly device directly to the second sub-assembly body. In another embodiment, the first electro-mechanical characteristic is selected from the group consisting of the interconnect dimension, the interconnect material, the interconnect structure and the shielding structure. In another embodiment, the first electro-mechanical characteristic is selected from the group consisting of the interconnect dimension, the interconnect material and the interconnect structure. In another embodiment, the first electro-mechanical characteristic is selected from the group consisting of the socket body material and the shielding structure.

In another embodiment, the interconnect structure includes a pin interconnect structure. In another embodiment, the pin interconnect structure includes a spring. In another embodiment, the pin interconnect structure includes a bend. In another embodiment, the interconnect dimension includes a pin interconnect dimension. In another embodiment, the interconnect structure includes a loopback path. In another embodiment, the loopback path includes a capacitor. In another embodiment, the loopback path includes an interconnect of a printed circuit board disposed within the first sub-assembly body. In another embodiment, the shielding structure includes an air gap.

In another implementation, a socket device comprises a socket body, a first plurality of interconnects, each extending in the socket body, to couple to an integrated circuit device, and a second plurality of pins interconnects, each extending in the socket body, to couple to the integrated circuit device, wherein a first zone of the socket body includes the first plurality of interconnects and a second zone of the socket body includes the second plurality of interconnects. Of the first zone and the second zone, only the first zone has a first electro-mechanical characteristic selected from the group consisting of an interconnect dimension, an interconnect material, an interconnect structure, a socket body material, and a shielding structure.

In an embodiment, the first electro-mechanical characteristic is selected from the group consisting of the interconnect dimension, the interconnect material, the interconnect structure and the shielding structure. In another embodiment, the first electro-mechanical characteristic is selected from the group consisting of the interconnect dimension, the interconnect material and the interconnect structure. In another embodiment, the first electro-mechanical characteristic is selected from the group consisting of the socket body material and the shielding structure. In another embodiment, the interconnect structure includes a pin interconnect structure. In another embodiment, the pin interconnect structure includes a spring. In another embodiment, the pin interconnect structure includes a bend. In another embodiment, the interconnect dimension includes a pin interconnect dimension.

In another embodiment, the interconnect structure includes a loopback path. In another embodiment, the loopback path includes a capacitor. In another embodiment, the loopback path includes an interconnect of a printed circuit board disposed within the first sub-assembly body. In another embodiment, the shielding structure includes an air gap. In another embodiment, the socket device further comprises a frame coupled to the socket body, the frame to receive the integrated circuit device and to couple the socket body to a printed circuit board. In another embodiment, the socket body is an assembly comprising a first sub-assembly including a first sub-assembly body having disposed therein the first plurality of interconnects, and a second sub-assembly including a second sub-assembly body having disposed therein the second plurality of interconnects, wherein the first sub-assembly has disposed therein connector hardware to couple the first sub-assembly to the second sub-assembly or to a frame coupled to the second sub-assembly.

In another implementation, a method comprises coupling an integrated circuit device to a socket assembly including a socket body, the coupling including coupling first contacts of the integrated circuit device to a first plurality of interconnects each extending in a first zone of the socket body, and coupling second contacts of the integrated circuit device to a second plurality of interconnects each extending in a second zone of the socket body. The method further comprises exchanging signals between the integrated circuit device and the socket assembly, wherein, of the first zone and the second zone, only the first zone has a first electro-mechanical characteristic selected from the group consisting of an interconnect dimension, an interconnect material, an interconnect structure, a socket body material, and a shielding structure.

In an embodiment, the method further comprises forming the socket assembly, including coupling a first socket sub-assembly to a second socket sub-assembly. In another embodiment, the first electro-mechanical characteristic is selected from the group consisting of the interconnect dimension, the interconnect material, the interconnect structure and the shielding structure. In another embodiment, the first electro-mechanical characteristic is selected from the group consisting of the interconnect dimension, the interconnect material and the interconnect structure. In another embodiment, the first electro-mechanical characteristic is selected from the group consisting of the socket body material and the shielding structure. In another embodiment, the interconnect structure includes a structure of a pin interconnect. In another embodiment, the structure includes a spring. In another embodiment, the structure includes a bend. In another embodiment, the interconnect dimension includes a pin interconnect dimension. In another embodiment, the interconnect structure includes a loopback path. In another embodiment, the loopback path includes a capacitor. In another embodiment, the loopback path includes an interconnect of a printed circuit board disposed within the socket body. In another embodiment, the shielding structure includes an air gap.

In another implementation, a system comprises a printed circuit board, and a socket assembly including a socket body, a first plurality of interconnects, each extending in the socket body, to couple to an integrated circuit device, a second plurality of pins interconnects, each extending in the socket body, to couple to the integrated circuit device, and a frame coupling the socket assembly to the printed circuit board. A first zone of the socket body includes the first plurality of interconnects and a second zone of the socket body includes the second plurality of interconnects. Of the first zone and the second zone, only the first zone has a first electro-mechanical characteristic selected from the group consisting of an interconnect dimension, an interconnect material, an interconnect structure, a socket body material, and a shielding structure.

In an embodiment, the first electro-mechanical characteristic is selected from the group consisting of the interconnect dimension, the interconnect material, the interconnect structure and the shielding structure. In another embodiment, the first electro-mechanical characteristic is selected from the group consisting of the interconnect dimension, the interconnect material and the interconnect structure. In another embodiment, the first electro-mechanical characteristic is selected from the group consisting of the socket body material and the shielding structure. In another embodiment, the interconnect structure includes a pin interconnect structure. In another embodiment, the pin interconnect structure includes a spring. In another embodiment, the pin interconnect structure includes a bend. In another embodiment, the interconnect dimension includes a pin interconnect dimension. In another embodiment, the interconnect structure includes a loopback path. In another embodiment, the loopback path includes a capacitor. In another embodiment, the loopback path includes an interconnect of a printed circuit board disposed within the first sub-assembly body. In another embodiment, the shielding structure includes an air gap. In another embodiment, the socket body comprises a first sub-assembly including a first sub-assembly body having disposed therein the first plurality of interconnects, and a second sub-assembly including a second sub-assembly body having disposed therein the second plurality of interconnects.

Techniques and architectures for providing socket connector structures are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A socket device, comprising:
a first socket sub-assembly having a first sub-assembly body;
a first plurality of interconnects, each extending in the first sub-assembly body, to couple to first contacts at a first side of an integrated circuit device, wherein the first socket sub-assembly directly couples only to a subset of all the contacts at the first side; and
a first connector structure formed in or on the first sub-assembly body;
a second socket sub-assembly having a second sub-assembly body, wherein the first connector structure of the first sub-assembly body is configured to couple the first socket sub-assembly to the second socket sub-assembly to form at least part of a socket assembly body that includes a first zone and a second zone, wherein the first zone includes the first plurality of interconnects, wherein the second zone includes a second plurality of interconnects extending in the second sub-assembly body, and wherein, of the first zone and the second zone, only the first zone has a first electro-mechanical characteristic selected from the group consisting of:
an interconnect dimension, an interconnect material, an interconnect structure, a socket body material, and a shielding structure.

2. The socket device of claim 1, wherein the second socket sub-assembly includes the second sub-assembly body, and wherein the first connector structure is configured to couple the first socket sub-assembly directly to the second sub-assembly body of the second socket sub-assembly.

3. The socket device of claim 1, wherein the first electro-mechanical characteristic of the first zone is different than a second electro-mechanical characteristic of the second zone, and wherein the first electro-mechanical characteristic is selected from the group consisting of:
the interconnect dimension, the interconnect material, the interconnect structure and the shielding structure.

4. The socket device of claim 1, wherein the first electro-mechanical characteristic is selected from the group consisting of:
the socket body material and the shielding structure.

5. The socket device of claim 1, wherein the interconnect structure includes a pin interconnect structure.

6. The socket device of claim 1, wherein the interconnect dimension includes a pin interconnect dimension.

7. The socket device of claim 1, wherein the interconnect structure includes a loopback path.

8. The socket Previously of claim 1, wherein the shielding structure includes an air gap.

9. A socket device, comprising:
a socket body having a top side that is opposite of a bottom side;
a first plurality of interconnects, each extending in the socket body, to couple to a bottom side of an electrical device; and
a second plurality of pin interconnects, each extending in the socket body, to couple to the first and second plurality of pin interconnects of the top side of the socket body to a plurality of contacts on the bottom side of the electrical device, wherein at least one or more of first plurality of interconnects and the second plurality of pin interconnects of the socket body extend from the top side of socket body and at least partially toward the bottom side of socket body;
wherein a first zone of the socket body includes the first plurality of interconnects and a second zone of the socket body includes the second plurality of pin interconnects, wherein the first zone has a first electro-mechanical characteristic and the second zone has a second electro-mechanical characteristic, and wherein, of the first zone and the second zone, only the first zone has the first electro-mechanical characteristic selected from the group consisting of:
an interconnect dimension, an interconnect material, an interconnect structure, a socket body material, and a shielding structure.

10. The socket device of claim 9, wherein the first electro-mechanical characteristic of the first zone is different than the second electro-mechanical characteristic of the second zone, and wherein the first electro-mechanical characteristic is selected from the group consisting of:
the interconnect dimension, the interconnect material, the interconnect structure and the shielding structure.

11. The socket device of claim 10, wherein the first electro-mechanical characteristic is selected from the group consisting of:
the interconnect dimension, the interconnect material and the interconnect structure.

12. The socket device of claim 9, wherein the first electro-mechanical characteristic is selected from the group consisting of:
the socket body material and the shielding structure.

13. The socket device of claim 9, wherein the interconnect structure includes a pin interconnect structure.

14. The socket device of claim 9, wherein the interconnect dimension includes a pin interconnect dimension.

15. The socket device of claim 9, further comprising a frame coupled to the socket body, the frame to receive the electrical device and to couple the socket body to a printed circuit board.

16. The socket device of claim 9, wherein the socket body is an assembly comprising:
- a first sub-assembly including a first sub-assembly body having disposed therein the first plurality of interconnects; and
- a second sub-assembly including a second sub-assembly body having disposed therein the second plurality of interconnects;
- wherein the first sub-assembly has disposed therein connector hardware to couple the first sub-assembly to the second sub-assembly or to a frame coupled to the second sub-assembly.

17. A method comprising:
- coupling an integrated circuit device to a socket assembly including a socket body having a top side that is opposite of a bottom side, the coupling including:
  - coupling first contacts on a bottom side of the integrated circuit device to a first plurality of interconnects each extending in a first zone of the socket body; and
  - coupling second contacts on a bottom side of the integrated circuit device to a second plurality of interconnects each extending in a second zone of the socket body; and
  - exchanging signals between the integrated circuit device and the socket assembly;
  - wherein the first zone has a first electro-mechanical characteristic and the second zone has a second electro-mechanical characteristic, and wherein, of the first zone and the second zone, only the first zone has the first electro-mechanical characteristic selected from the group consisting of:
    - an interconnect dimension, an interconnect material, an interconnect structure, a socket body material, and a shielding structure.

18. The method of claim 17, further comprising forming the socket assembly, including coupling a first socket sub-assembly to a second socket sub-assembly.

19. The method of claim 17, wherein the first electro-mechanical characteristic of the first zone is different than the second electro-mechanical characteristic of the second zone, and wherein the first electro-mechanical characteristic is selected from the group consisting of:
- the interconnect dimension, the interconnect material, the interconnect structure and the shielding structure.

20. The method of claim 17, wherein the first electro-mechanical characteristic is selected from the group consisting of:
- the socket body material and the shielding structure.

21. The method of claim 17, wherein the interconnect structure includes a structure of a pin interconnect.

22. A system comprising:
- a printed circuit board; and
- a socket assembly including:
  - a socket body;
  - a first plurality of interconnects, each extending in the socket body, to couple to an integrated circuit device;
  - a second plurality of pins interconnects, each extending in the socket body, to couple to the integrated circuit device; and
  - a frame coupling the socket assembly to the printed circuit board;
  - a second socket sub-assembly having a second sub-assembly body, wherein a first connector structure of a first sub-assembly body is configured to couple the first socket sub-assembly to the second socket sub-assembly to form at least part of a socket assembly body that includes a first zone and a second zone,
  - wherein the first zone of the socket body includes the first plurality of interconnects and the second zone of the socket body includes the second plurality of interconnects, wherein the first zone has a first electro-mechanical characteristic and the second zone has a second electro-mechanical characteristic, and wherein, of the first zone and the second zone, only the first zone has the first electro-mechanical characteristic selected from the group consisting of:
    - an interconnect dimension, an interconnect material, an interconnect structure, a socket body material, and a shielding structure.

23. The system of claim 22, wherein the first electro-mechanical characteristic of the first zone is different than the second electro-mechanical characteristic of the second zone, and wherein the first electro-mechanical characteristic is selected from the group consisting of:
- the interconnect dimension, the interconnect material, the interconnect structure and the shielding structure.

24. The system of claim 23, wherein the first electro-mechanical characteristic is selected from the group consisting of:
- the interconnect dimension, the interconnect material and the interconnect structure.

* * * * *